United States Patent [19]

Steube

[11] 4,233,937
[45] Nov. 18, 1980

[54] VAPOR DEPOSITION COATING MACHINE

[75] Inventor: Kenneth E. Steube, St. Charles, Mo.

[73] Assignee: McDonnell Douglas Corporation, St. Louis, Mo.

[21] Appl. No.: 926,561

[22] Filed: Jul. 20, 1978

[51] Int. Cl.² .............................................. C23C 13/08
[52] U.S. Cl. .................................. 118/727; 118/50.1;
 118/500; 118/728; 118/733
[58] Field of Search ............... 118/500, 49.1, 50, 51.1,
 118/727, 728, 733, 50.1

[56] References Cited

U.S. PATENT DOCUMENTS

| | | | |
|---|---|---|---|
| 2,912,351 | 11/1959 | Danner et al. | 118/500 |
| 3,543,717 | 12/1970 | Adachi | 118/49.1 |
| 3,928,659 | 12/1975 | Baxter | 118/49.1 |
| 4,116,161 | 9/1978 | Steube | 118/49.1 |

FOREIGN PATENT DOCUMENTS 692996 6/1940 Fed. Rep. of Germany ........... 118/500

Primary Examiner—Bernard D. Pianalto
Attorney, Agent, or Firm—Gravely, Lieder & Woodruff

[57] ABSTRACT

A machine for vapor coating a workpiece with a coating metal supplied in wire form includes a vessel enclosing a vacuum chamber and having a door for providing access to the vacuum chamber. The vessel is connected with a vacuum pump for evacuating the vacuum chamber. Mounted within the vacuum chamber is a rack having an attachment screen which is electrically isolated from the remainder of the vessel so that the screen may be placed at a DC potential significantly higher than the vessel. When the door of the vessel is open, the rack may be withdrawn from the chamber for loading the workpiece thereon. The chamber also contains a carriage that moves from one side of the chamber to the other beneath the rack, and the carriage has a plurality of evaporator units mounted along it. Each evaporator unit includes a trough-like boat and means for feeding the coating metal wire into the boat. An electrical potential is impressed across the boat, which functions as a resistance-type heater, and that potential is sufficient in magnitude to elevate the temperature of the boat enough to melt the coating metal wire fed into it. Once all of the evaporator units in the carriage are operating consistently, the carriage is moved across the chamber one or more times, and the vaporized coating metal emitted from the boat is deposited on the workpiece, providing a firmly bonded uniform coating.

17 Claims, 12 Drawing Figures

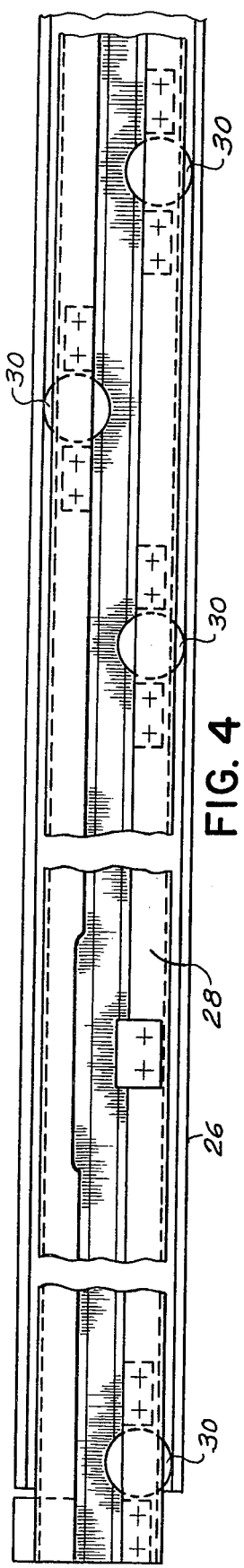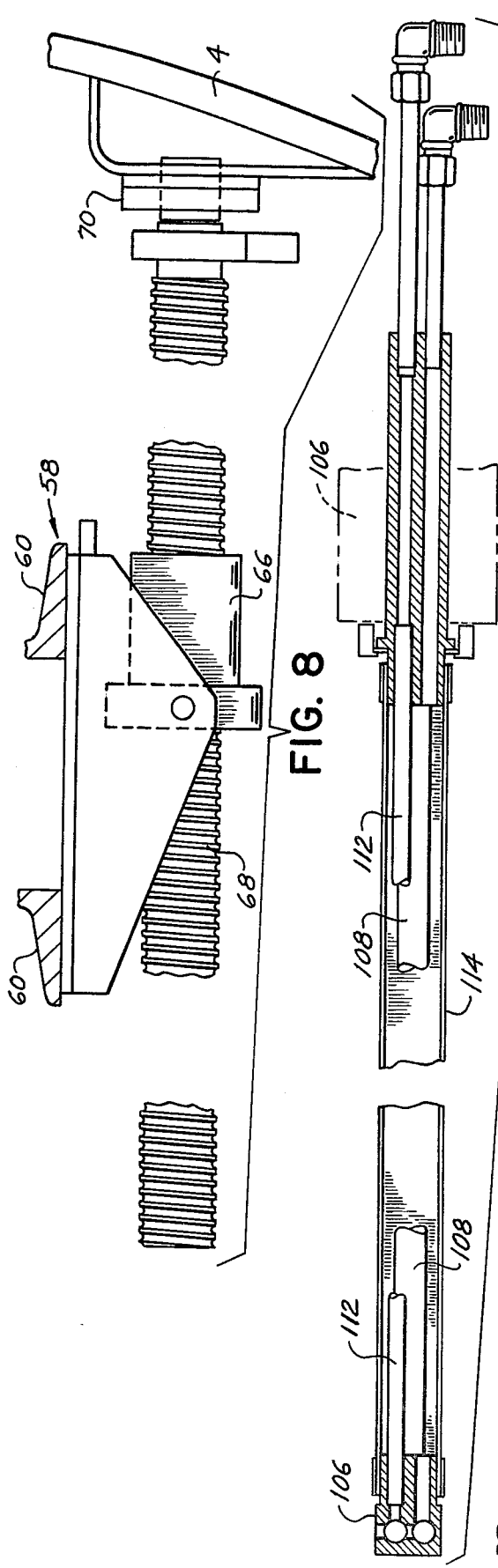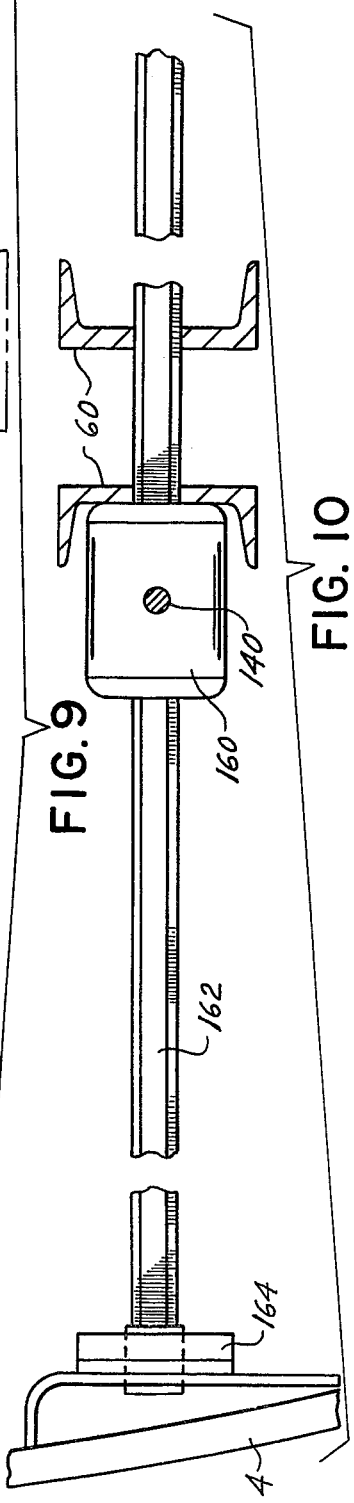

VAPOR DEPOSITION COATING MACHINE

BACKGROUND OF THE INVENTION

This invention relates to coating by vapor deposition and more particularly to a vapor deposition coating machine that is capable of coating large objects with metal.

Various processes exist for coating substances, particularly metals, with metal, usually for the purpose of enhancing the appearance of the coated substance or protecting the coated substance from its environment, or both. For example, a chromium finish is applied to steel through electroplating procedures to improve the appearance of the steel and to a lesser measure to inhibit oxidation. Similarly, steel is often coated with zinc so as to provide a protective coating as well as a sacrificial anode. Aluminum shapes and the like when subjected to anodizing treatments are provided with attractive and durable coatings.

Of all the metal coating processes, perhaps ion vapor deposition, which is a vacuum vapor plating process, provides the most secure bond between the metal substrate and the metal coating. Indeed, the bond is characterized by relatively deep diffusion between the molecules of the two metals at the interface between those metals. In short, it is similar to a diffusion bond. The effectiveness of the bond to a large measure derives from the ability to thoroughly clean the substrate as an adjunct of the ion vapor deposition process and to deposit the metal coating in a powerful ion bombardment.

Heretofore coating by ion vapor deposition procedures has been confined to relatively small objects, because the machines for practicing such procedures were incapable of accommodating large objects. This left larger objects for other, less effective coating procedures. U.S. Pat. Nos. 3,750,623 and 3,926,147 illustrate the most efficient apparatus heretofore developed for coating by ion vapor deposition. In each, the workpiece that is to be coated is an extremely small object, such as a machine screw. The apparatus does not have the capability of coating large sheet metal shapes or other large objects such as might be utilized in the airframe of a high performance aircraft.

SUMMARY OF THE INVENTION

One of the principal objects of the present invention is to provide a machine or apparatus for coating large substrates with a desired metal using vapor deposition procedures. Another object is to provide a machine of the type stated which is ideally suited for coating large flat shapes. A further object is to provide a machine of the type stated in which the object to be coated remains stationary in a vacuum chamber and the source of coating metal moves within the chamber opposite the object to be coated. An additional object is to provide a machine of the type stated which provides a generally uniform coating. These and other objects and advantages will become apparent hereinafter.

The present invention is embodied in a vacuum coating machine including a vessel that forms a vacuum chamber, means for evacuating the vessel, means for supporting a workpiece within the vacuum chamber, an evaporator unit within the chamber and including a trough-like boat and means for introducing the coating metal into the boat, means for heating the boat sufficiently to melt the coating metal introduced into it, and means for moving the evaporator unit through the chamber. The invention also consists in the parts and in the arrangements and combinations of parts hereinafter described and claimed.

DESCRIPTION OF THE DRAWINGS

In the accompanying drawings which form part of the specification and wherein like numerals and letters refer to like parts wherever they occur:

FIG. 4 is a sectional view taken along line 4—4 of FIG. 3 and showing the slide and channel that support the rack;

FIG. 8 is a fragmentary sectional view taken along line 8—8 of FIG. 5 and showing one of the nuts by which the carriage of the evaporator assembly is coupled with its lead screw;

FIG. 9 is a sectional view taken along line 9—9 of FIG. 6 and showing the electrical cable that leads to the common electrode of the carriage as well as the cooling hoses for that cable;

FIG. 10 is a sectional view taken along line 10—10 of FIG. 5 and showing the right angle gear box and the shafts which power the wire feed devices of the evaporator units;

DETAILED DESCRIPTION

Figure 1:
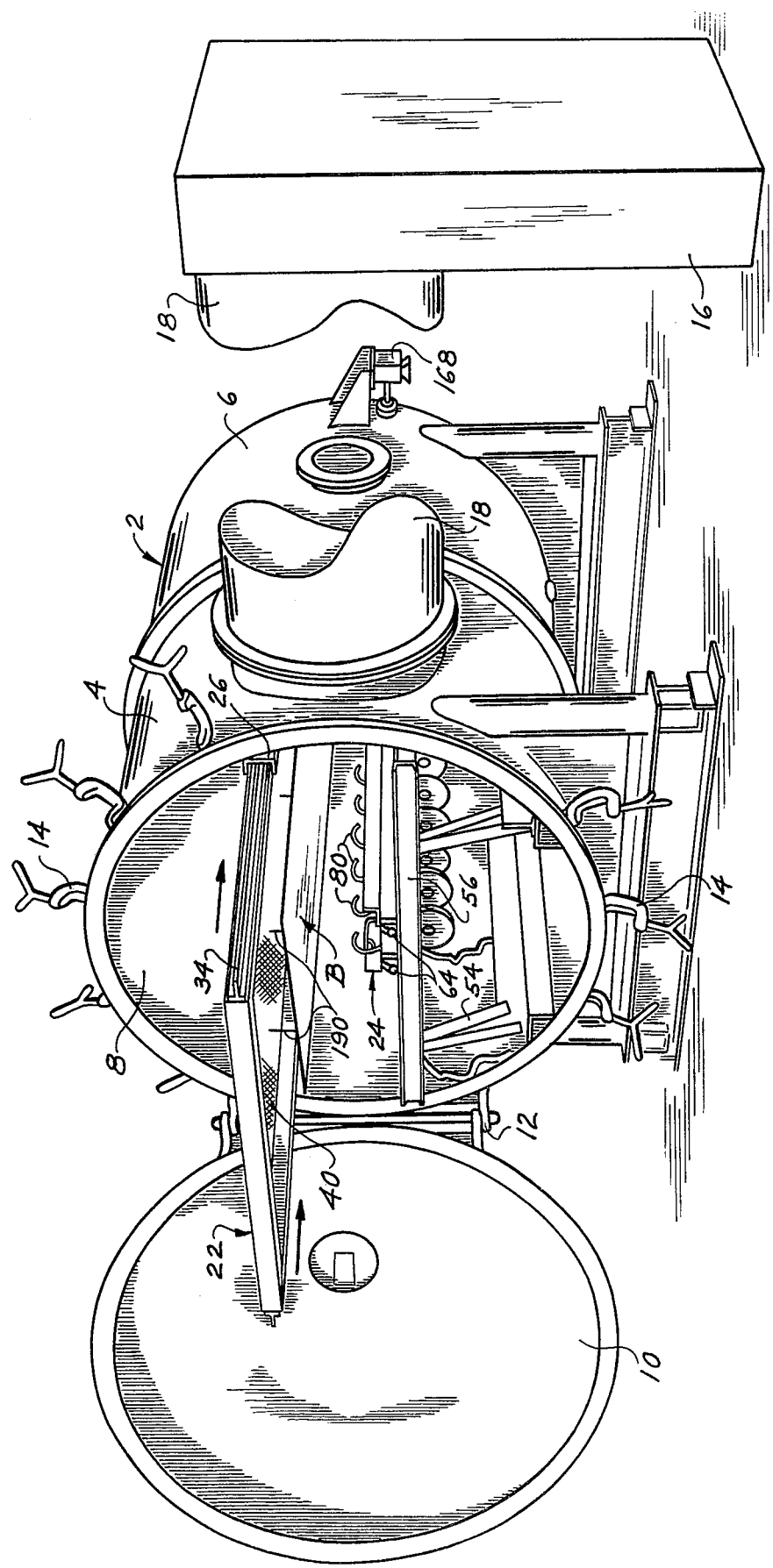
FIG. 1 is a perspective view of a vapor deposition coating machine constructed in accordance with the invention, and with the door of the vacuum vessel open and the rack partially withdrawn.

Referring now in detail to the drawings (FIG. 1), A designates a machine for depositing a thin metal coating on a relatively large workpiece B such as a sheet metal shape or the like. The metal of the coating may be aluminum or any of the metal which lends itself to ion vapor deposition. Similarly, the metal of the workpiece may be any metal that is capable of accepting metal deposited by ion vapor deposition. Such metals are, titanium, steel, and aluminum, to name a few. Of course, the deposited metal and the substrate metal should be compatible.

The machine A includes (FIG. 1) a vacuum vessel 2 of cylindrical configuration which typically may be 7 feet in diameter and 12 feet in length. The vessel 2 has a cylindrical wall 4 and an end wall 6 that is welded to one end of the cylindrical wall 4, thereby forming a cylindrical vacuum chamber 8 that is permanently closed at its one end. The other end, when the chamber 8 is under vacuum, is closed by a door 10 supported on a hinge 12. The door 10 is secured firmly against the end of the cylindrical wall 4 by clamps 14. The chamber 8 is connected to a vacuum pump 16 through duct 18 that opens into the chamber 8 through the cylindrical wall 4. In addition, the cylindrical wall 4 contains viewing ports 20 (FIG. 11) for observing the interior of the chamber 8 under vacuum conditions. The cylindrical chamber 8 contains two basic components (FIGS. 1 & 2), namely a rack 22 by which the workpiece B is supported and an evaporator assembly 24 which discharges the metal that is deposited on the workpiece B. The rack 22 is located slightly above the center axis of the cylindrical chamber 8, while the evaporator assembly 24 is located slightly below the center axis. This arrangement enables the workpiece B, when suspended from the rack 22, to be located at about the level of the center axis and directly above the evaporator assembly 24.

Figure 2:
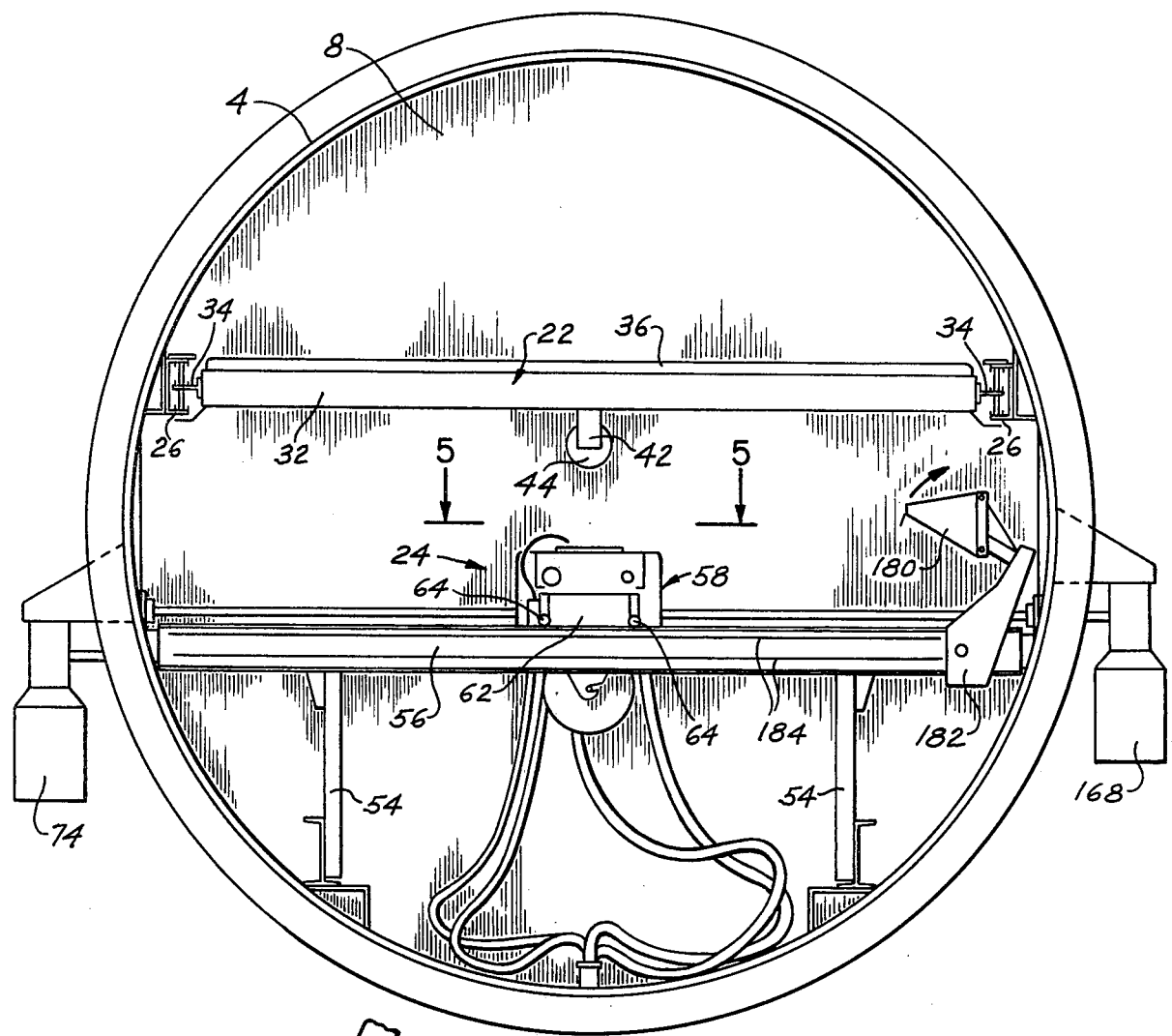
FIG. 2 is an elevational view looking into the open end of the vessel.
Figure 3:
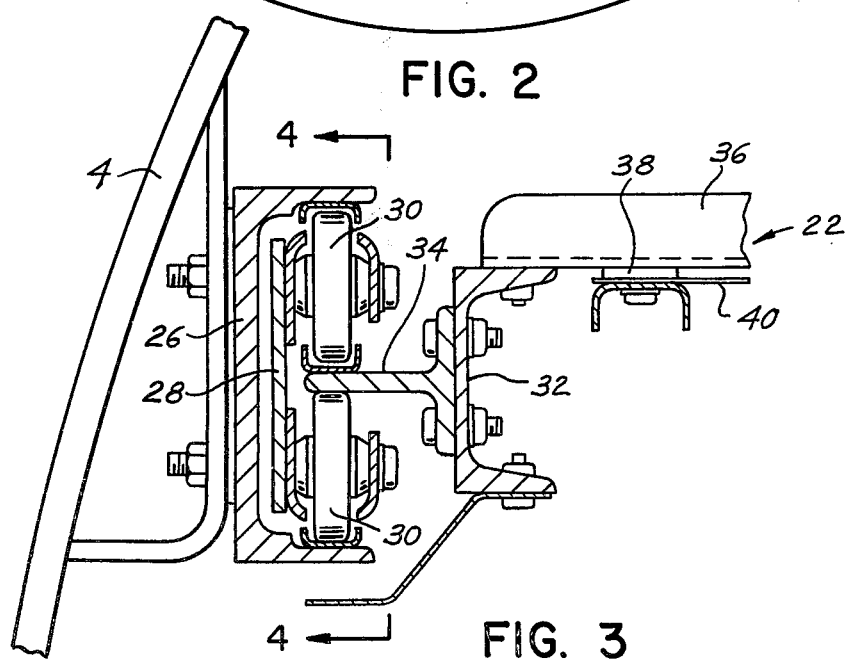
FIG. 3 is a fragmentary sectional view showing the channel and slide which support the rack.

The rack 22 is supported on a pair of channels 26 (FIG. 2) which are mounted securely on the cylindrical wall 4 of the vessel 2 with the one being directly across the chamber 8 from the other. The two channels 26 open inwardly, and each contains a slide 28 (FIGS. 3 & 4) that moves longitudinally within it. Each slide 28 has a series of upper and lower wheels 30 which roll along the upper and lower flanges, respectively, of the channel 26 for that slide 28. While the upper wheels 30 need not be located directly opposite the lower wheels 30—and for the most part they are not—the peripheries of neither the upper nor the lower wheel 30 extend past the longitudinal centerline of the slide 28. Indeed, a slight gap exists along the longitudinal centerline between the upper and the lower wheels 30.

The rack 22 is actually supported on the slides 28, which in turn are supported on the channels 26. The rack 22 includes (FIGS. 1–3) a frame 32 of rectangular configuration, with the frame 32 being long enough to extend substantially the entire length of the chamber 8 and wide enough to extend from one slide 28 to the other. Along each side, the frame 36 has a flange 34 (FIG. 3), and the two flanges 34 project laterally into the spaces between the upper and lower wheels 30 of the slide 28. Thus, the rack 22 rests on the lower wheels 30, yet may be pulled completely out of the chamber 8 when the door 10 is open. As the rack 22 moves out of the chamber 8, so do the slides 28, but at only one-half the velocity, so that when the rack 22 is completely out of the chamber 8, it is supported beyond the channels 26 on the slides 28. While the lower wheels 30 continue to support the rack 22 from beneath, the upper wheels 30 prevent the rack 22 from tipping over the front ends of the slides 28. In short, the rack 22 operates much like a fully suspended drawer of the type utilized in file cabinets.

Figure 5:
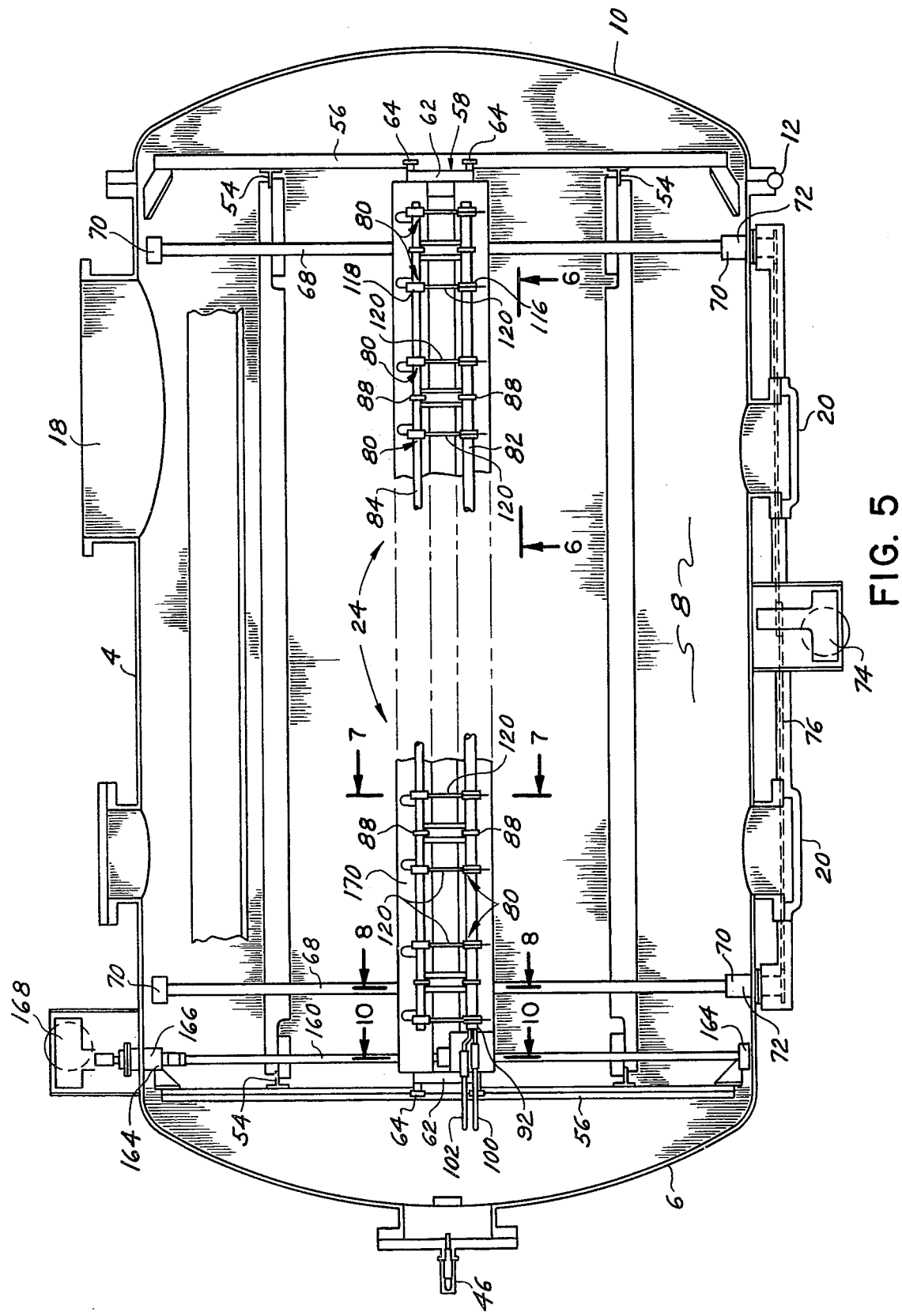
FIG. 5 is a sectional view taken along line 5—5 of FIG. 2 and showing the evaporator assembly in plan.

The rack frame 32 has cross members 36 (FIG. 3) which extend from one side of the frame 32 to the other, and attached to these cross members 36 are dielectric insulators 38 which in turn have an expanded metal screen 40 attached to them. The arrangement is such that the screen 40 is secured firmly to the rack frame 32, yet is electrically isolated from the frame 32 as well as the vacuum vessel 2. The screen 40 has a spring contactor 42 (FIG. 2) at its back end, and that contactor aligns with a contact 44 on the end wall 6 of the vessel 2. The contact 44, in turn, is connected to the positive terminal or anode of a direct current voltage source through a lead 46 (FIGS. 5 & 11) that passes through the end wall 6. Thus, when the rack 22 is in its rearmost position, that is the position it assumes when wholly within the chamber 8, the spring contactor 42 bears against the contact 44, and the screen 40 may be connected with the high positive potential. However when the rack 22 is pulled outwardly, the contactor 42 separates from the contact 44, insuring that the screen 40 is at a neutral voltage.

The evaporator assembly 24 rests on a supporting framework 54 (FIGS. 2 & 5) that is attached to the cylindrical wall 4 of the vessel 2 in the lower position of the vacuum chamber 8. The framework 54 has a pair of horizontal cross rails 56 which extend completely across the vacuum chamber 8, with one being located near the door 10. The evaporator assembly 24 moves over the rails 56 from one side of the vacuum chamber 8 to the other and back again.

Figure 6:
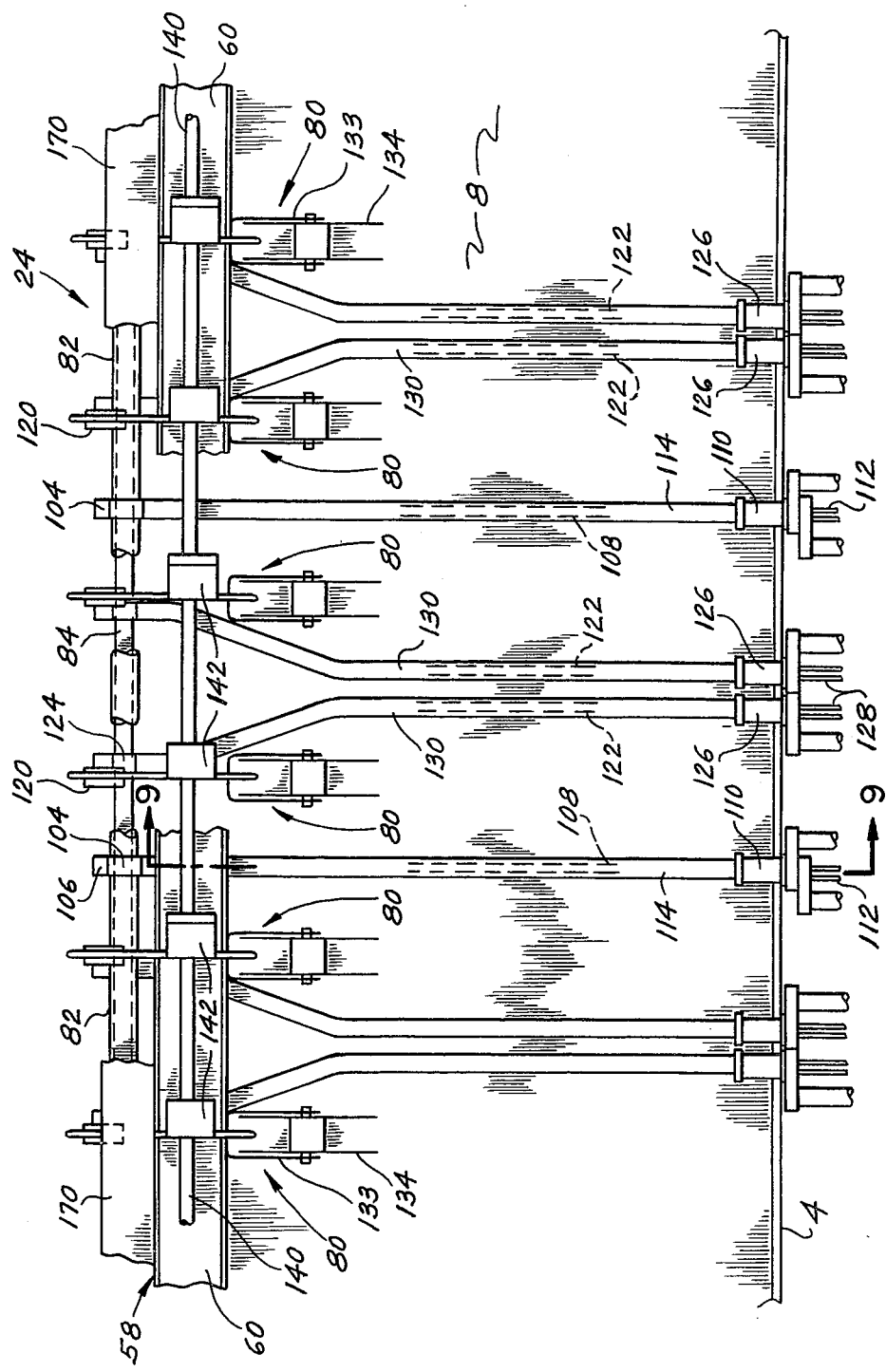
FIG. 6 is a fragmentary sectional view of the evaporator unit and connecting cables taken along line 6—6 of FIG. 5.
Figure 11:
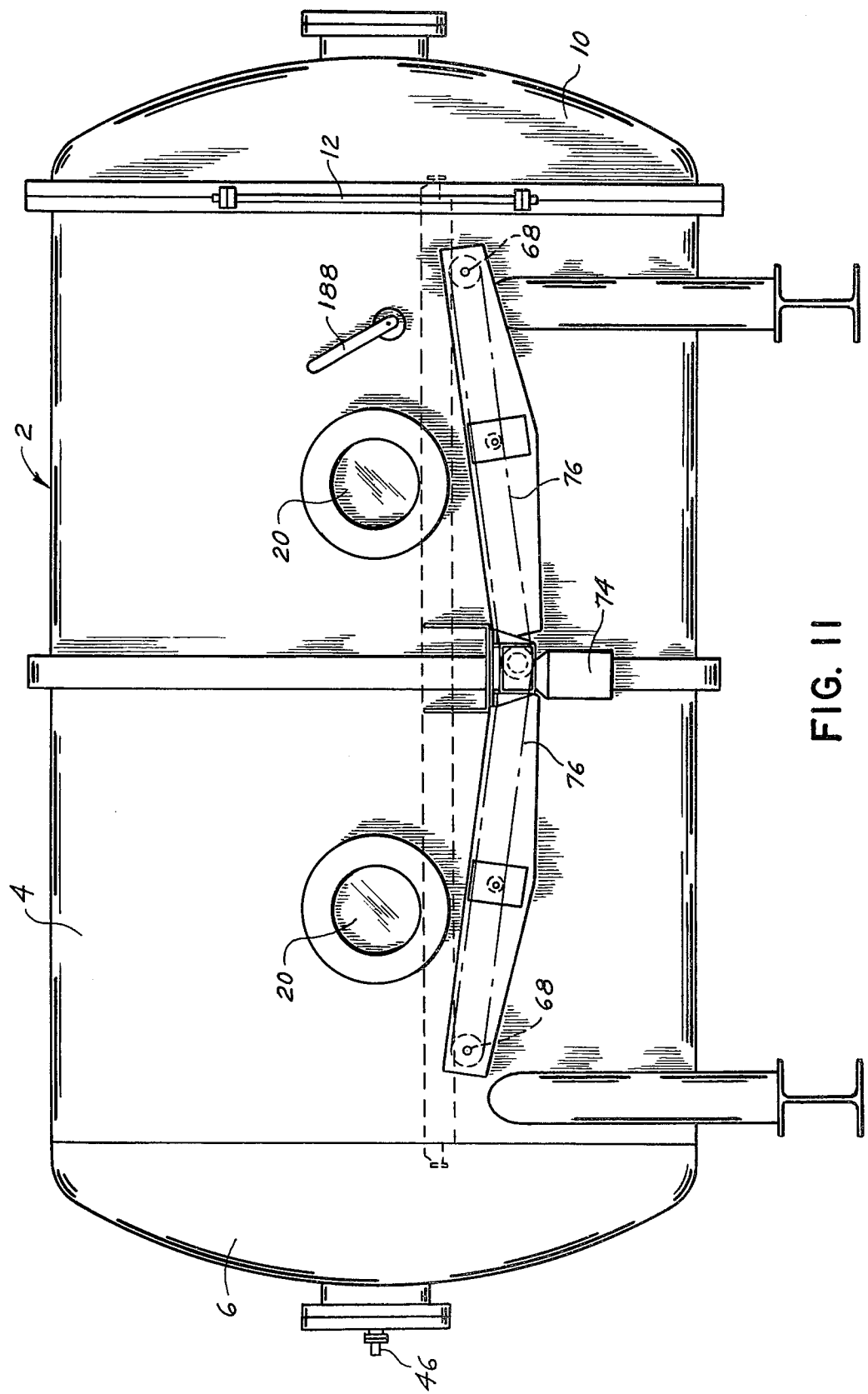
FIG. 11 is a side elevational view of the vacuum vessel forming part of the invention.

The evaporator assembly 24 includes a carriage 58 (FIGS. 5 & 7) consisting of a pair of longitudinal beams 60 (FIGS. 6 & 7) that extend practically the entire length of the chamber 8, and these beams at their ends are connected by blocks 62 (FIGS. 2 & 5), each of which has a pair of rollers 64 on it. The rollers 64 ride on the cross rails 56. Set inwardly on the carriage 58 from each end block 62 is a nut 66 (FIG. 8) and each nut 66 has a lead screw 68 (FIG. 5) extended through it. The two lead screws 68 have their ends located in bearings 70 mounted on the cylindrical wall 4 of the vessel 2. The bearings 70 at one side of the chamber 8 are incorporated into seal or vacuum pass through units 72 through which the ends of the lead screws 68 pass. Beyond the seal units 72, the end of the two lead screws 68 are connected with a reversible gear motor 74 through a sprocket and chain drive 76 (FIG. 11).

The gear motor 74 is mounted on the exterior surface of the vessel 2. When the gear motor 74 is energized, the two lead screws 68 revolve, and since they are connected with the carriage 58 at the nuts 66, the rotary motion of the screws 68 is converted into translational motion for the carriage 58. Thus, the carriage 58 moves along the cross rails 56, and since the motor 74 is reversible, the carriage 58 may be moved from one side of the chamber 8 to the other and then back again. The carriage 58 supports a plurality of evaporator units 80 (FIGS. 5–7) which are mounted in succession at equally spaced intervals along the beams 60 of the carriage 58.

All the evaporator units 80 are serviced by several common appliances that are likewise mounted on the carriage 58. These include a common electrode 82 (FIGS. 5 & 7) of tubular configuration which extends along one side of the carriage 58 and a parallel support tube 84 that extends along the other side of the carriage 58. Actually, the electrode 82 and support tube 84 rest on cross blocks 86, which span the two beams 60 of the carriage, and are secured firmly to the blocks 86 by clips 88.

The common electrode 82 which is formed in a tubular configuration from a suitable metal such as copper, is closed at its end closest to the door 10 by an end fitting, and at its other end by an adapter 92 (FIG. 5) Extended through the interior of the hollow electrode 82 from the adapter 92 to the end fitting is a water tube 98 (FIG. 7) that is considerably smaller in diameter than the electrode 82. The opposite end of the water tube 98 is in communication with the interior of the tubular electrode 82 through a return passage in the end fitting. Coupled to the water tube 98 and the electrode 82 at the adaptor 92 are flexible water hoses 100 and 102, respectively (FIG. 5), which extend downwardly to pass through fittings in the cylindrical wall 6, beyond which the former is connected with a supply of cooling water and the latter with a drain. The cooling water from the hose 100 flows through the adaptor 92 to the water tube 98 which delivers that water to the end fitting. Here the cooling water reverses direction and is discharged into the interior of the common electrode 82 where it flows back toward the adaptor 92. The water leaves the adaptor 92 and flows out of the vacuum chamber 8 through the flexible hose 102, beyond which it is discharged to a drain. In this manner cooling water is continually circulated through the common electrode 82 to prevent it from overheating under high current loads.

At four locations along its length, the common electrode 82 is embraced by a clamp-type connector 104 (FIGS. 6 & 7) and each of these is in turn bolted to an end fitting 106 at which a flexible electrical cable 108 terminates. Each cable 108 originates at a fitting 110 (FIG. 6) in the bottom of the cylindrical wall 4, there being a separate fitting 110 for each cable 108. Also extended between each pair of fittings 106 and 110 is a small diameter inlet hose 112, and a large diameter outlet hose 114. Indeed, both the cable 108 and the inlet hose 112 are located within the outlet hose 114 (FIG. 9). At the exterior of the vessel 2, cooling water is introduced into the inlet hose 112 and that water flows upwardly to the end fitting 106 where it is reversed in direction and returned through the outlet hose 114. This flow of water maintains the cable 108 at reasonably low temperatures under heavy current loads. The fitting 110 in the cylindrical wall 4 electrically isolates the two hoses 112 and 114 as well as the cable 108 from the vessel 2.

Figure 12:
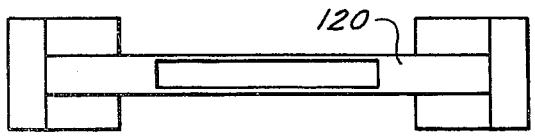
FIG. 12 is a top plan view of the boat for an evaporator unit.

Each evaporator unit 80 includes (FIG. 7) a clamp-type bracket 116 that fits around the common electrode 82 and another clamp-type bracket 118 that fits around the support tube 84. The brackets 118 and 116 which are located directly opposite from each other, are connected by an evaporator boat 120 which is, in effect, an upwardly opening trough (FIG. 12) formed from a substance that is a good electrical conductor and is further capable of withstanding high temperatures on the order of 1800° C., since the boat serves as a resistance type heating element between the two brackets 116 and 118. Intermetallic composites are suitable for the boat 120. The brackets 116 and 118 are formed from a metal such as copper, which is capable of conducting electricity, and in comparison to the boat 120, they are quite massive.

Inasmuch as the bracket 116 is clamped around the common electrode 82 it remains at the same electrical potential as the electrode 82, which is connected to a source of alternating current through the water cooled cables 108. Heat from the bracket 116 is transferred to the common electrode 82 by conduction.

The other bracket 118 is connected to he source of alternating current through a separate flexible cable 122 (FIGS. 6 & 7) so that the alternating current is impressed across the boat 120 to heat the same. The cable 122 extends between an end fitting 124 on the bracket 118 and a pass through fitting 126 (FIG. 6) in the bottom of the cylindrical wall 4 for the vessel 2. The fitting 124 electrically connects the cable 122 with the bracket 118, while the fitting 126 electrically isolates the cable 122 from vessel 2. Alongside the cable 122 is an inlet hose 128 for conducting cooling water and both the cable 122 and the inlet hose 128 are contained within an outlet hose 130 that likewise extends from the lifting 126 in wall 4 to the end fitting 124 on the bracket 118. Cooling water supplied through the inlet hose 128 passes upwardly to the end fitting 124 where it is reversed in direction and discharged into the outlet hose 130. As the cooling water flows outwardly through the hose 130, it cools the cable 122, preventing it from overheating under high current demands. Heat from the bracket 118 is transferred to the fitting 124 by conduction. The cable 122 and its fittings 124 and 126 and and hoses 128 and 130 are practically identical to their counterparts associated with the cable 108 (FIG. 9).

In addition to the bracket 116 and 118 and the evaporator boat 120 that extends between them, the evaporator unit 80 further has a wire feed device 132 (FIG. 7) that includes a bifurcated spool holder 133 that is attached to the beams 60 at the bottom of the carriage 58 for holding a spool 134 of wire w, the metal of the wire w being that which is desired to be imparted to the workpiece B as a coating over it. In most instances, this metal will be aluminum. Leading away from the spool 134 is an initial guide tube 136 which is mounted on and terminates at a bearing block 138 that is secured to the beam 60 over which the common electrode 82 passes. Extended through the bearing block 138 is a wire feed shaft 140, which is fitted with a drive roller 142 over which the wire w passes after emerging from the initial guide tube 136. The wire w is forced tightly against the drive roller 142 by an idler roller 144 that is carried on a spring loaded link 146 which is likewise mounted on the bearing block 138. The link 146 may be depressed to move the idler roller 144 away from drive roller 142 so that the wire w from the spool 134 may be hand fed between the two rollers 140 and 142. The block 138 also has a final guide tube 148 mounted on it, and this tube extends upwardly away from the drive roller 142 and loops over the common electrode 82 and the bracket 116 on it, with the end of the final tube 148 being directed toward the upwardly opening trough of the evaporator boat 120. Thus, as the feed shaft 140 revolves, the drive roller 142 will withdraw wire w from the spool 134 and will force it upwardly through the final guide tube 148. The wire w emerging from the final tube 148 passes into the evaporator boat 120 and if the boat 120 is hot enough, the wire w will melt to form a pool of molten metal within the boat 120.

The remaining evaporator units 80 are identical in construction, and those units are spaced evenly over the entire top of the carriage 58. Thus, the evaporator units 80 are located along the entire length of the rack 20 from which workpieces B are suspended.

The wire feed shaft 140 extends along the entire length of the carriage 58 (FIG. 6) and passes through the bearing blocks 138 of all the evaporator units 80 so that the wire feed shaft 140 is common to and powers the wire feed devices 132 of all the units 80. At the end of the carriage 58 closest to the end wall 6, the carriage 58 is fitted with a right angle gear box 160 (FIG. 10) into which the feed shaft 140 extends, and the gear box 160 has a splined drive shaft 162 (FIG. 5) extended completely through it at a right angle to the feed shaft 140. Indeed, the drive shaft 162 extends horizontally through the vacuum chamber 8 and has its ends confined in bearings 164 mounted on the cylindrical wall 4 of the vessel 2. The one bearing 164 is formed integral with a seal or pass through unit 166, which enables the shaft 162 to extend completely through the wall 4 while a vacuum is maintained in the chamber 8. Beyond the seal unit 164 the shaft 162 is coupled with a variable speed gear motor 166 that is mounted on the exterior surface of the wall 4. When the motor 168 is energized, it rotates the drive shaft 162 which, being coupled to the feed shaft 140 through the gear box 160, rotates the feed shaft 140 and the rollers 142 on the feed shaft 140. The rollers 142 in turn drive the wire w upwardly through the final guide tubes 148 of the various evaporator units 80. Moreover, the spline or the drive shaft 162 fits loosely through the gear box 160 so that as the carriage 58 moves across the vacuum chamber 8, the gear box 160 merely slides over the shaft 162, yet remains engaged with the shaft 162 from a rotary standpoint.

To prevent the evaporator units 80 from coating important components of the evaporator assembly 24, the carriage 58 is provided with a shield 170 (FIGS. 5-7) that extends generally over the top and along the side of it. The shield 170 completely obscures the wire feed device 132 and the feed shaft 140. If further covers the common electrode 82 and the support tube 84. However, along its top it has apertures through which the evaporator boats 120 are fully exposed. Also the lead screws 68 and the drive shaft 162 are encapsulated in bellows (not shown) which expand and contract as the carriage 58 moves left and right through the vacuum chamber 8.

Not only does the evaporator assembly 24 possess a shield 172, but the vessel 2 likewise contains a shield 180 (FIG. 2) that is located along one side of the chamber 8 and is capable of being moved between lowered and raised positions. In the lowered position, the shield 180 will overlie the boat 120 on the evaporator assembly 24, assuming that the evaporator assembly 24 is at the side of the chamber 8 at which the shield 180 is located, and this enables the shield 180 to prevent coating of the workpiece B. However, when the shield 180 is moved to its raised position, it no longer obscures the workpiece B and indeed the boats 120 are exposed directly to the workpiece B so that the molten metal within them will be deposited on the workpiece B. Actually, the shield 180 is hinged to a bracket 182 which in turn is secured to the side of the cylindrical wall 4 for the vessel 2.

The shield 180 is pivoted between its raised and lowered positions by a cable 184 which at both of its ends attaches to the shield and extends therefrom in two passes generally along the front cross rail 56 and thence along the opposite side of the cylindrical wall to a drum which is operated by a handle 188 (FIG. 11) located outside the vessel 2. Thus, when the handle 188 is moved, the cable 184 shifts and pivots the shield 180. The direction in which the shield 180 moves is, of course, dependent on the direction in which the handle 188 is turned.

OPERATION

To prepare the coating machine A for coating a workpiece B, the door 10 of the vacuum vessel 2 is opened and the rack 22 is withdrawn as far as possible so as to be presented entirely outside of vacuum chamber 8 (FIG. 1). Then, by means of hooks 190, the workpiece B is suspended from the screen 40 of the rack 22. Next the rack 22 is moved back into the vessel 2 so as to be housed entirely within the vacuum chamber. In this regard, the hooks 190 should be short enough to prevent the workpiece B from interferring with the evaporator units 80 on the carriage 58. When the rack 22 reaches its fully inserted position, the spring contactor 42 on the expanded metal screen 40 will bear against the contact 44 on the end wall 6 of the vessel 2. Next, the gear motor 74, is energized to move the carriage 58 to that side of the chamber 8 at which the movable shield 180 is located. Also, the shield 180 is moved to its lowered position by turning the handle 188, and in that position the shield 180 overlies all of the evaporator units 80 on the carriage 58.

Once the rack 22, the workpiece B, the carriage 58 and the movable shield 180 have assumed the foregoing positions, the door 10 is closed and the clamps 14 are tightened to secure the door 10 in place. Next, the vacuum pump 16 is energized to evacuate the vacuum chamber 8. Indeed, the pump 16 lowers the pressure in the chamber to about $10^{-4}$ mm Hg, whereupon the chamber 8 is partially back-filled with argon or some other inert gas until the pressure reaches $1 \times 10^{-2}$ to $2 \times 10^{-2}$ mm Hg., while the low pressure inert gas is in the chamber 8 a high negative voltage on the order of 1,000 to 2,000 volts DC is applied to the workpiece B. Actually, this voltage is impressed across the metal screen 40 on the rack 22 and the vacuum vessel 2, so that the workpiece B is at an electrical potential substantially different from that of the vacuum vessel 2 and the carriage 58 within it. In this condition, a phenomenon known as glow discharge occurs and as a result of glow discharge argon ions bombard the surface of the workpiece B. This bombardment removes any foreign particles so that the surface of the workpiece B is absolutely clean. In short, glow discharge cleans the workpiece atomically. The glow discharge cleaning lasts for 15 to 30 minutes, depending on the size and configuration of the workpiece B.

Once the glow discharge cleaning has been completed, an alternating electrical current is applied to the cables 108 and 122, and this potential is impressed across the boats 120 at the clamp-type brackets 116 and 118. The boats 120, being resistance-type heating elements, experience a rise in temperature, and indeed the rise is sufficient to bring the temperature of the boats 120 above the temperature at which the metal of the coating wire w will melt. The heat which is developed is prevented from destroying the common electrode 82 by the cooling water which is circulated through that electrode. Similarly, the cables 108, which conduct current to the electrode 82, are maintained at a reasonable temperature by the water which is circulated through the inlet and the outlet hoses 112 and 114 associated with those cables 108. Likewise, the cables 122, which conduct current to the clamp-type brackets 118 of the boats 120, are prevented from over heating by cooling water circulated through their inlet and outlet hoses 128 and 130.

Figure 7:
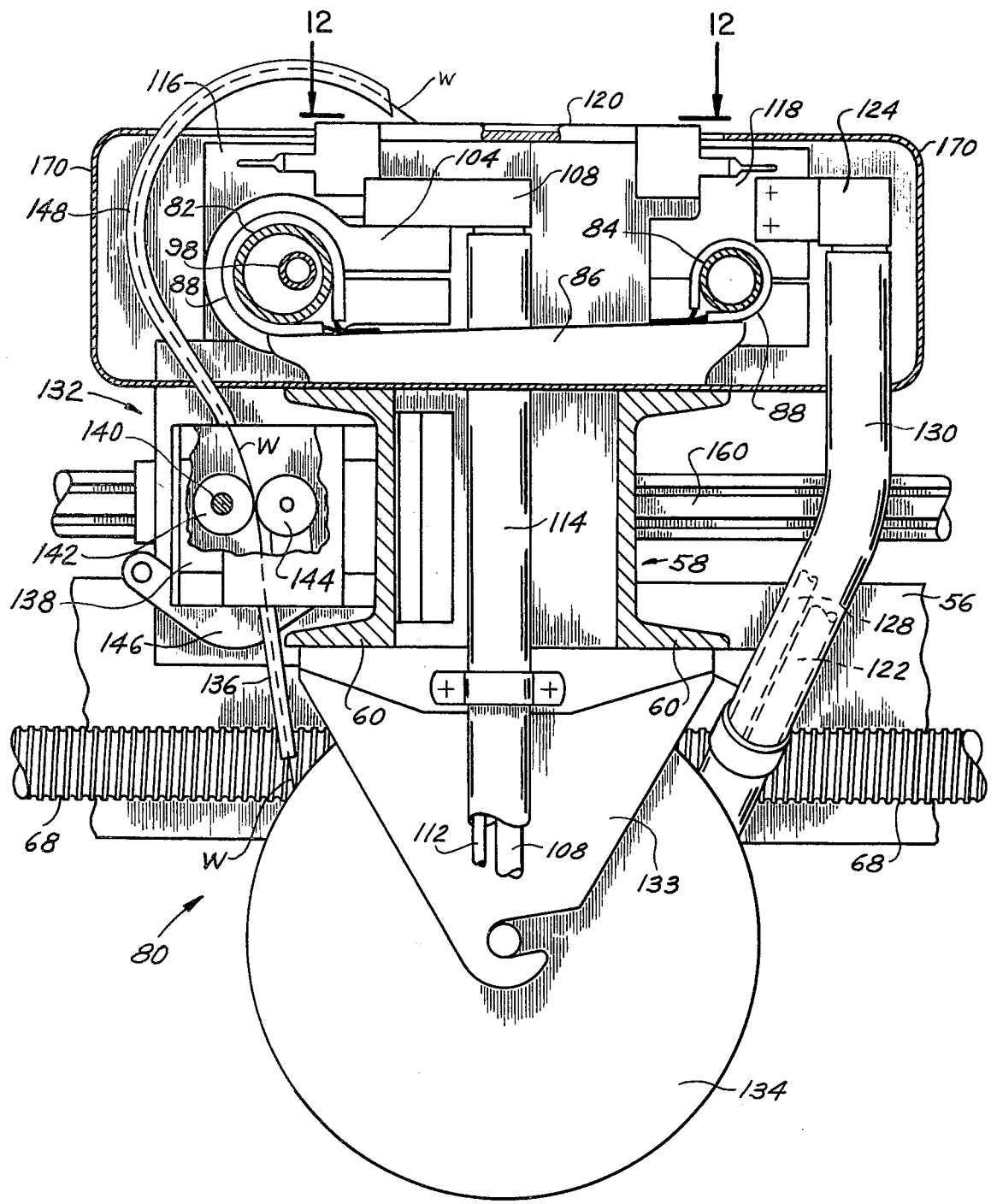
FIG. 7 is a sectional view of one of the evaporator assemblies, showing one of the evaporator units on it in elevation.

When the boats 120 reach the proper operating temperature, the gear motor 168 is energized, and this motor powers the drive shaft 162 which in turn rotates the wire feed shaft 140 that is common to all of the evaporator units 80. Each roller 142 on the feed shaft 140 bears against a different coating wire w and drives that coating wire w upwardly through the upper guide tube 148 which in turn directs the wire w downwardly into the boat 120 where the wire w melts and into a molten pool (FIG. 7). Due to the extremely low pressure in the vacuum chamber 8, the molten metal in effect evaporates quite rapidly from the pool and migrates through the vacuum chamber 8. The gear motor 168 is adjusted to feed the wire w at precisely the rate at which the metal evaporates from the pool so that the pool contains the same amount of molten metal for the duration of the coating operation.

Once all of the evaporator units 80 on the carriage 58 are operating consistently, the handle 188 at the exterior of the vessel 2 is turned to move the shield 180 upwardly to its raised position. This exposes the workpiece B to the evaporator boats 120, and by reason by the substantial difference in electrical potential between the workpiece B and the metal of the pool, the evaporated metal is attracted to the workpiece B which is coated thereby. To provide a uniform coating, the gear motor 74 is energized, and it rotates the lead screws 68 which in turn move the carriage 58 over the cross rails 58 to the other side of the vacuum chamber. Indeed, the carriage 58 may be moved back and forth several times merely by reversing the motor 74, and in this manner a coating of practically any desired thickness may be acquired.

The coating produced by the machine A is extremely secure and durable, for it is in effect diffusion bonded to the workpiece B. Furthermore, since the carriage moves through chamber 8 the workpiece can be almost as wide and as long as the chamber 8 itself. This is to be distinguished with ion vapor deposition machines of conventional structure which are suitable for coating only extremely small objects such as machine screws, nuts annd the like.

Whereas the machine A is well suited for ion vapor deposition coating, it may also be used for mere physical vapor deposition. In that case, the workpiece B and the boats 120 remain at the same potential. In other words, in physical vapor deposition, the screen 40 of the rack is not placed at a high negative DV voltage. The application of metal to glass so as to form mirrors is an example of physical vapor deposition.

This invention is intended to cover all changes and modifications of the example of the invention herein chosen for purposes of the disclosure which do not constitute departures from the spirit and scope of the invention.

What is claimed is:

1. A vapor disposition coating machine for applying a coating metal to a workpiece, said machine comprising: an air-tight vessel having walls which enclose a vacuum chamber and define a door opening, the vessel also having a door which when closed seals the door opening and when opened provides access to the vacuum chamber; a rack supported on the vessel within the vacuum chamber for holding a workpiece in a fixed position within the vacuum chamber; a carriage located within the vacuum chamber below the rack, the carriage being substantially narrower than the rack, but about the same length as the rack; means for moving the carriage in translation beneath the rack generally from one side of the vessel to the other; a plurality of evaporator units mounted on the carriage generally along the entire length thereof, each evaporator unit including a boat in the shape of an upwardly opening trough, the boat being formed from a substance that is capable of conducting an electrical current and serving as a resistance type heating element, each evaporator unit also including means for feeding the coating metal in wire form into the trough of the boat for that unit; first and second current conducting means extended between the boats and fixed locations on a wall of the vessel for delivering electrical energy to the boats, the first conducting means being connected to one end of each boat and the second conducting means being connected to the opposite end of each boat, both the first and second conducting means being flexible, at least in part, to accommodate movement of the carriage in the chamber; and means for circulating a fluid coolant along the first and second conducting means to dissipate heat therefrom, the means for circulating the fluid coolant also being flexible so as to flex with first and second conducting means.

2. A machine according to claim 1 wherein the means for moving the carriage includes a lead screw that extends through the carriage and is engaged therewith, the lead screw further being extended through the wall of the vessel, and a motor that is located exteriorly of the vessel and is conneced with the lead screw for turning the screw.

3. A machine according to claim 1 wherein the means for feeding the coating metal into the trough of the boat includes means for holding a reel of the wire coating meal, a roller bearing against the wire beyond the reel for withdrawing the wire from the reel, and means for guiding the wire into the trough of the boat.

4. A machine according to claim 3 wherein the means for guiding the wire into the trough of the boat is a guide tube through which the wire is driven, the guide tube being located between the drive roller and the boat.

5. A machine according to claim 1 wherein the means for feeding the coating metal in wire form into the boat of each evaporator unit includes means for holding a reel of the wire, and a roller bearing against the wire beyond the reel for withdrawing the wire from the reel and feeding it into the trough of the boat when rotated; and wherein a common drive shaft extends along the carriage and drives the rollers of all of the evaporator units.

6. A machine according to claim 5 and further comprising a gearbox on the carriage and having one end connected to the drive shaft for the rollers, a cross shaft extended in the direction that the carriage moves and having a spline thereon that passes through the gearbox, so that the cross shaft remains engaged with the gearbox irrespective of the position of the carriage in the vacuum chamber, and a motor connected with the cross shaft for rotating the cross shaft.

7. A machine according to claim 5 wherein the common drive shaft extends through and the rollers are mounted on the common drive shaft.

8. A machine according to claim 1 and further comprising a pair of parallel tracks mounted on the walls of the vessel within the vacuum chamber and a slide on the tracks, the rack being engaged with the slide and the slide enabling the rack to be withdrawn completely from the vacuum chamber to facilitate loading workpieces thereon.

9. A machine according to claim 1 and further comprising a shield mounted within the vessel adjacent to one side of the vacuum chamber and being movable between a position in which it overlies the evaporator unit when the unit is at said one side of the chamber and a position in which it is located to the side of the evaporator unit so as to expose the workpiece to the evaporator unit.

10. A machine according to claim 1 wherein the first conducting means comprises a rigid common electrode that extends along one side of the carriage with one end of each boat being connected to that electrode.

11. A machine according to claim 10 wherein the second conducting means comprises a plurality of individual conductors each connected to the other end of one of the boats.

12. A machine according to claim 1 and further comprising rails within the vacuum chamber; and wherein the carriage is supported on and moves along the rails.

13. A machine according to claim 1 and further comprising means for enabling the rack to be withdrawn through the door opening so that it can be removed from the vacuum chamber to facilitate the loading of the workpiece upon it.

14. A vapor deposition coating machine for applying a coating metal to a workpiece, said machine comprising: an air-tight vessel having walls which enclose a vacuum chamber and define a door opening located at one end of the vessel, the vessel also having a door which when closed seals the door opening and when opened provides access to the vacuum chamber; means for evacuating air and other gases from the vacuum chamber to produce a vacuum therein; a rack within the vacuum chamber for holding a workpiece; means for supporting the rack such that the rack can be withdrawn through the door opening when the door is open and moved to a loading position outside of the vacuum chamber to facilitate loading a workpiece on the rack; a carriage within the vacuum chamber below the rack, the carriage being substantially narrower than the rack; means for moving the carriage beneath the rack generally from one side of the vessel to the other; a plurality of evaporator units mounted on the carriage one after the other for generally the entire length of the carriage, each evaporator unit including a boat in the shape of an upwardly opening trough, the boat being formed from a substance that conducts electrical current and serves as a resistance-type heating element, each evaporator unit also including means for feeding the coating metal in wire form into the trough of the boat; electrical conductors connected to the ends of the boats and across a source of electrical energy for delivering electrical energy to the boats, the conductors being flexible at least in part to accommodate movement of the carriage in the vacuum chamber; and means for dissipating heat from the conductors.

15. A machine according to claim 14 and further comprising a shield mounted on the vessel at one side of the vacuum chamber and being movable between a shielding position wherein it overlies the evaporator units on the carriage and an open position wherein it is located to the side of the evaportor units and causes the rack and the workpiece thereon to be exposed to the evaporator units.

16. A machine according to claim 15 and further comprising rails mounted in the vessel and extended horizontally through it for supporting the carriage; and wherein the means for moving the carriage comprises at least one lead screw which extends through the carriage and has its threads engaged with the carriage, and means for rotating the lead screw.

17. A machine according to claim 14 and further comprising means for placing the rack at an electrical potential different from that of the boats.

* * * * *